United States Patent [19]
Osann, Jr. et al.

[11] Patent Number: 5,384,433
[45] Date of Patent: Jan. 24, 1995

[54] PRINTED CIRCUIT STRUCTURE INCLUDING POWER, DECOUPLING AND SIGNAL TERMINATION

[75] Inventors: Robert Osann, Jr., San Jose; Jeffery A. Ausman, Milpitas; David R. Halbert, Campbell, all of Calif.

[73] Assignee: Aptix Corporation, San Jose, Calif.

[21] Appl. No.: 32,723

[22] Filed: Mar. 16, 1993

Related U.S. Application Data

[63] Continuation of Ser. No. 785,435, Oct. 29, 1991.

[51] Int. Cl.$^6$ ............................................. H05K 1/00
[52] U.S. Cl. ................... 174/250; 174/261; 174/262; 174/265; 361/768
[58] Field of Search ............... 174/250, 254, 255, 261, 174/262, 266; 361/760, 767, 768, 772, 777, 780, 784, 792; 228/180.2; 439/68, 70

[56] References Cited

U.S. PATENT DOCUMENTS

| | | | |
|---|---|---|---|
| 2,482,998 | 9/1949 | Andersson | 173/328 |
| 2,932,772 | 4/1960 | Bowman et al. | 317/101 |
| 2,963,626 | 12/1960 | Du Val, Jr. et al. | 317/99 |
| 3,214,827 | 11/1965 | Phohofsky | 29/155.5 |
| 3,217,283 | 11/1965 | Shlesinger, Jr. | 339/18 |
| 3,267,407 | 8/1966 | Humphries et al. | 339/18 |
| 3,299,393 | 1/1967 | Kelley et al. | 339/18 |
| 3,434,095 | 3/1969 | De Rose | 339/18 |
| 3,492,627 | 1/1970 | Tauscher | 339/17 |
| 3,605,063 | 9/1971 | Stewart | 339/18 R |
| 3,648,221 | 3/1972 | Tillmann et al. | 339/74 R |
| 3,760,329 | 9/1973 | Stepan | 339/18 C |
| 3,880,486 | 4/1975 | Avakian | |
| 4,051,550 | 9/1977 | Seno et al. | 361/402 |
| 4,220,810 | 9/1980 | Arai et al. | |
| 4,413,309 | 6/1983 | Takahashi et al. | 361/406 |
| 4,413,309 | 11/1983 | Takahashi et al. | 361/406 |
| 4,434,321 | 2/1984 | Betts | 361/409 X |
| 4,628,409 | 12/1986 | Thompson et al. | 361/403 |
| 4,754,366 | 6/1988 | Hernandez | 361/306 |
| 4,866,507 | 9/1989 | Jacobs et al. | 174/261 X |
| 4,870,225 | 9/1989 | Anao et al. | 361/406 X |
| 4,874,907 | 10/1989 | Ishikawa | 361/406 X |
| 4,889,961 | 12/1989 | Carlson | 29/846 |
| 4,967,316 | 10/1990 | Goebel et al. | 361/424 |

*Primary Examiner*—Leo P. Picard
*Assistant Examiner*—Cheryl R. Figlin
*Attorney, Agent, or Firm*—D'Alessandro, Frazzini & Ritchie

[57] ABSTRACT

A printed circuit board includes an array of conductive pads including component-mounting holes disposed on first and second surfaces thereon. An array of conductive attachment lands arranged in pairs of first and second attachment lands are disposed on the first and second surfaces. The first and second attachment lands are insulated from one another and separated by a distance selected to allow attachment of standard sized components therebetween on the first and second surfaces of said circuit board. First and second conductive power distribution planes are disposed on the first and second surfaces and are insulated from the conductive pads and the second attachment lands disposed thereon. The first attachment land of each pair on the first surface of the circuit board is electrically connected to the first power distribution plane and the first attachment land of each pair on the second surface of the circuit board is electrically connected to the second power distribution plane, and the second attachment land of each pair on the first and second surfaces of the circuit board electrically connected to one of the conductive pads.

4 Claims, 3 Drawing Sheets

PRINTED CIRCUIT STRUCTURE INCLUDING POWER, DECOUPLING AND SIGNAL TERMINATION

CROSS-REFERENCE TO RELATED APPLICATION

This application is a continuation application of U.S. patent application Ser. No. 07/785,435, filed Oct. 29, 1991.

BACKGROUND OF THE INVENTION

1. Field of the Invention

The present invention relates to electronics assembly technology. More particularly, the present invention relates to printed circuit board technology and to an integrated printed circuit board layout scheme for power distribution, power supply decoupling, and signal termination.

2. The Prior Art

Printed circuit boards are well known and widely used in the electronics industry. They allow rapid, repeatable and reliable automated assembly of electronic components into electronic circuits. As circuit technology, especially integrated-circuit technology, has developed, printed circuit technology has necessarily co-evolved to keep pace with the ever increasing complex interconnectivity requirements of electronic circuits and devices which must be mounted on printed circuit boards. Accordingly, double-sided printed circuit boards, plated-through component mounting holes, and multilayer printed circuit board technology has evolved to meet the needs of circuit designers to provide compact and densely functional circuits for electronic systems.

Printed circuit technology has also played a role in circuit development and prototyping. Printed circuit boards have been designed to facilitate breadboarding for prototype circuit development. Such printed circuit boards usually provide a matrix or other network of component-mounting holes connected to conductive traces which provide power distribution to the components. An example of such printed circuit board technology is the provision of power and ground plane conductors on a printed circuit board designed for use with integrated circuit packages. In one configuration, a printed circuit board includes conductive traces connecting the power and ground planes to particular pads associated with holes for mounting of wire wrap integrated circuit sockets. The connectivity pattern between the pads and the power planes is chosen to match the power supply pins commonly employed in selected families of integrated circuit devices.

In another known configuration, power and ground plane conductors are provided on the printed circuit board between and adjacent to rows of component mounting holes. Connections between the plane conductors and the power supply pins on the mounted components are made by placing small bridging clips over selected ones of the component pins and soldering the clips to the pins and to the power plane conductor to form a bridging connection between the pin and the power or ground plane trace on the circuit board. An example of such technology is a printed circuit board, part no. 3682-2, available from Vector Corporation of Sylmar, Calif.

There also are a number of power supply decoupling schemes in use for printed circuit board applications. For example, printed circuit boards have been provided with pairs of contact pads and mounting holes for decoupling capacitors distributed over the surface of the printed circuit board. One of the contact pads of each pair is electrically connected to one of the power plane conductors and the other is connected to the other power plane conductor. An example of a printed circuit board including such a feature is part No. 8096-048, available from Twin Industries, Inc. of Santa Clara, Calif.

In addition, general component connection capability has been available in one form or another in printed circuit board technology. Usually, components are mounted in holes associated with contact pads to which they may be soldered. The components may then be connected to the circuits by techniques such as wire wrapping.

What is lacking in the printed circuit board technology is an integrated solution to the problems of power distribution, power supply decoupling, and signal termination. An ideal solution to this problem would be the provision of a printed circuit board layout which allows the functions of power distribution, power supply decoupling, and signal termination to be available to any component mounting hole and its associated electrical contact pad without resort to additional board space to accommodate the added functionality or the need to employ additional interconnection methods once the component to serve this function has been mounted.

BRIEF DESCRIPTION OF THE INVENTION

According to the present invention, a printed circuit board structure includes a combined and versatile power, decoupling, and signal termination feature. According to a presently preferred embodiment of the invention, a printed circuit board includes an array of conductive pads including component-mounting holes disposed on first and second surfaces thereon. An array of conductive attachment lands arranged in pairs of first and second attachment lands are disposed on the first and second surfaces. The attachment lands may be used for mounting a variety of surface mounted components according to the present invention.

The first and second attachment lands are insulated from one another and separated by a distance selected to allow attachment of standard sized components, such as chip capacitors or resistors therebetween on the first and second surfaces of said circuit board. First and second conductive power distribution planes are disposed on the first and second surfaces and are insulated from the conductive pads and the second attachment lands disposed thereon. The first attachment land of each pair on the first surface of the circuit board is electrically connected to the first power distribution plane and the first attachment land of each pair on the second surface of the circuit board is electrically connected to the second power distribution plane, and the second attachment land of each pair on the first and second surfaces of the circuit board electrically connected to one of the conductive pads.

According to another aspect of the present invention, one of the attachment lands of each pair, preferably the first attachment land, is sized such that different sized surface mount components may be mounted between the first and second attachment lands of each pair.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
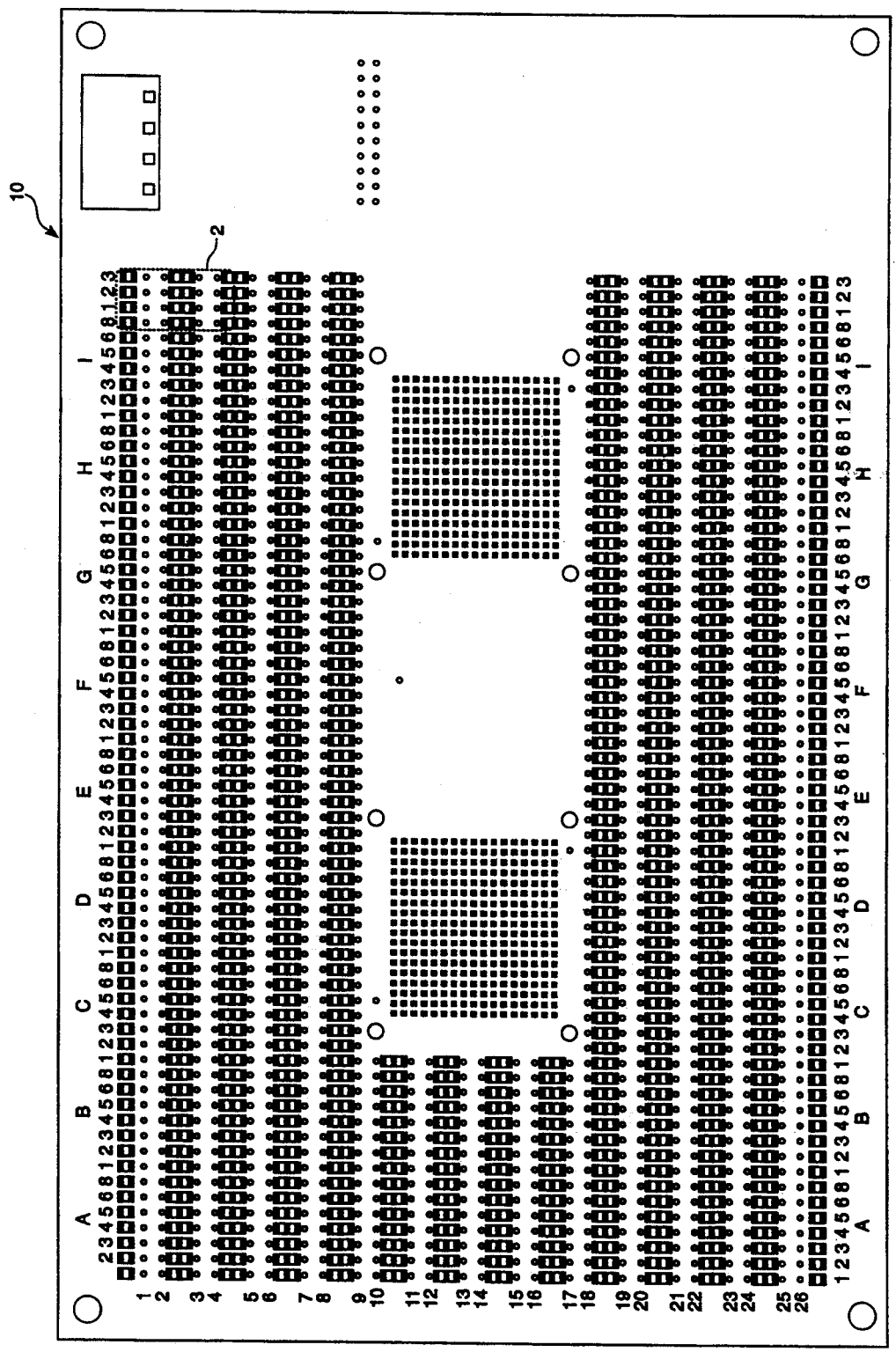
FIG. 1 is a top view of an exemplary printed circuit board fabricated in accordance with the principles of the present invention.
Figure 2:
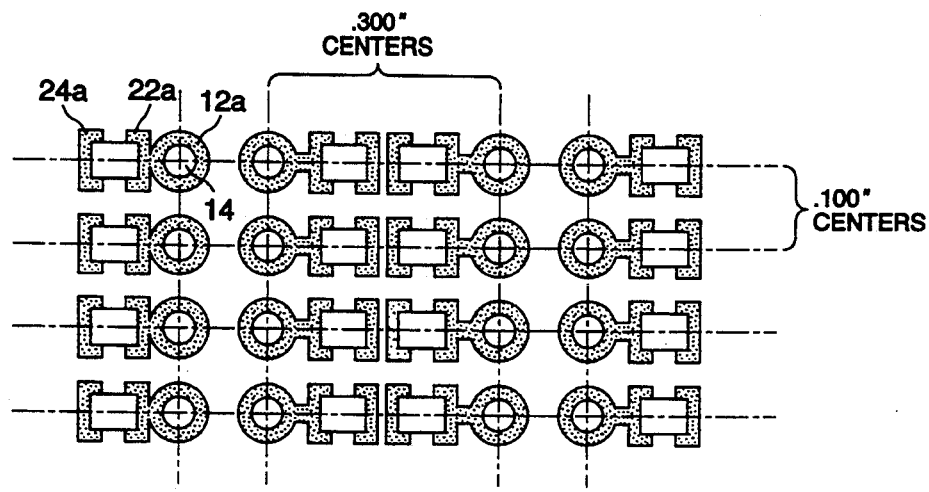
FIG. 2 is a magnified view of a portion of the printed circuit board surrounded by box 2 of FIG. 1, showing the details of the present invention in more detail.

Referring first to FIGS. 1 and 2, a top view of an exemplary embodiment of a printed circuit board 10 incorporating the features of the present invention and a magnified portion of that top view are shown, respectively. As can be seen most clearly from FIG. 2, the top and bottom surfaces of printed circuit board 10 includes a plurality of regularly spaced contact pads 12 including holes 14 for mounting electronic components, such as integrated circuits.

In an illustrative printed circuit board fabricated in accordance with the present invention, and as indicated in FIG. 2, the holes 14 may be located on 0.1 inch centers in one direction and on 0.3 inch centers in the other direction to allow mounting of commonly-encountered dual in line (DIP) integrated circuit packages on circuit board 10. Those of ordinary skill in the art will recognize that this suggested hole spacing is one of many hole spacing schemes which may be employed in carrying out the present invention. Those of ordinary skill in the art will recognize that the opposite view of circuit board 10 exposing its bottom face is essentially identical to the top view illustrated in FIG. 1.

Referring now to FIGS. 1, 2, and 3a and 3b, a plurality of pairs of attachment lands are provided on the opposing top and bottom faces 16 and 18, respectively, of circuit board 10 for mounting of surface-mounted components, as will be described further herein. The areas of the top and bottom faces of printed circuit board 10 which are not occupied by contact pads 12 and attachment lands may be covered by power distribution planes 20a and 20b for delivering power supply voltages to the components to be mounted on printed circuit board 10. The power distribution planes 20a and 20b are insulated from the contact pads 12 and from one of the members of each pair of attachment lands. The board material, labelled "FPCB", is an insulator. While in a presently preferred embodiment the power distribution planes 20a and 20b may occupy substantially all of the area of the face of the printed circuit board 10 not occupied by contact pads 12 or attachment lands, those of ordinary skill in the art will recognize that the power distribution planes 20a and 20b may occupy smaller areas on one or both faces of the printed circuit board 10.

According to the present invention, each pair of attachment lands includes an attachment land (reference numerals 22a and 22b on the top and bottom surfaces, respectively, of printed circuit board 10) electrically connected to a contact pad (12a and 12b on the top and bottom surfaces, respectively, of printed circuit board 10) and an attachment land (reference numerals 24a and 24b on the top and bottom surfaces, respectively, of printed circuit board 10) connected to the power distribution planes 20a and 20b. The attachment lands 22a and 22b and 24a and 24b for each pair of attachment lands on the top and bottom surfaces 16 and 18 of printed circuit board 10 are spaced apart by a selected amount chosen to allow for the mounting of selected surface mount components. For example, in an embodiment of the present invention where the surface mounted components are 0805 or 1206 size components (80 mils by 50 mils and 120 mils by 60 mils, respectively), proper sizing and spacing of the attachment lands will allow for the mounting of both sizes of components.

Figure 3A:
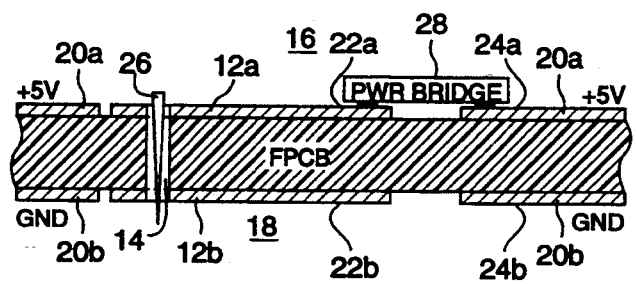
FIGS. 3a–3c are cross sectional views of the portion of the printed circuit board of FIG. 2 taken through lines 3—3 showing typical components mounted thereon.
Figure 3B:
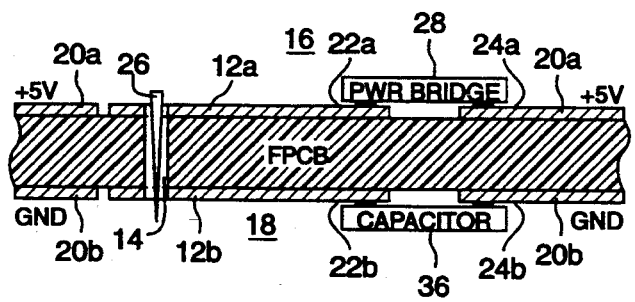
Figure 3C:
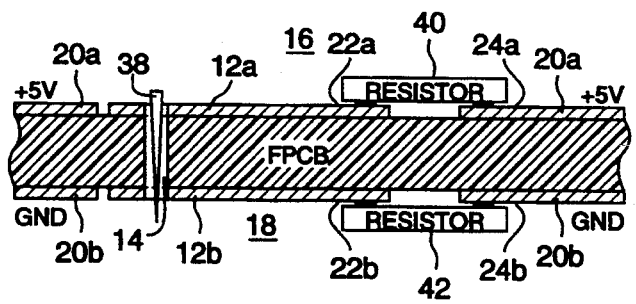
Figure 4A:
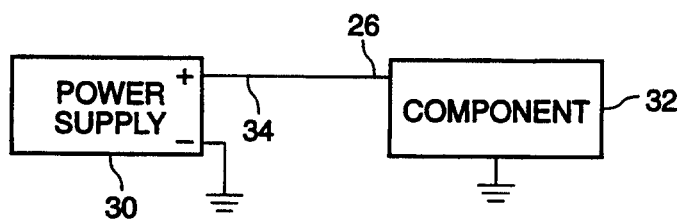
FIGS. 4a–4c are schematic diagrams corresponding to FIGS. 3a–3c, respectively, representing the typical power supply distribution, decoupling, and signal termination connections which may be easily and interchangeably made using the printed circuit board layout of the present invention.
Figure 4B:
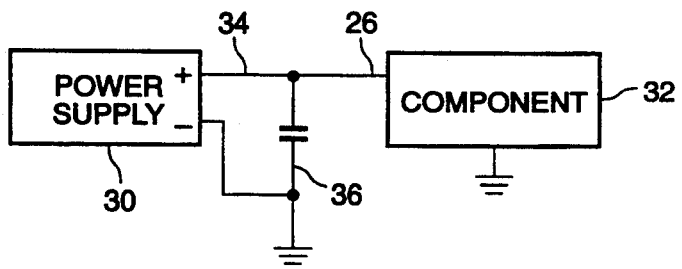
Figure 4C:
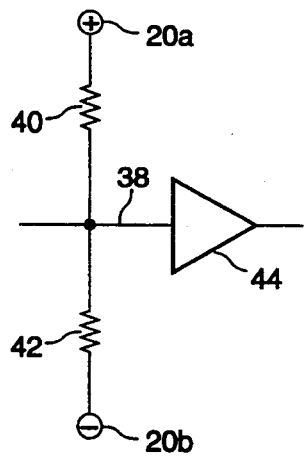

Referring now to FIGS. 3a–3c and 4a–4c, the advantages of the present invention are shown and will become apparent to those of ordinary skill in the art upon inspection. FIGS. 3a–3c show the connections of surface mounted components to the attachment lands 22a and 22b and 24a and 24b of printed circuit board 10 of the present invention to accomplish power distribution, power supply decoupling, and signal terminations, respectively. Corresponding FIGS. 4a–4c are schematic diagrams illustrating the connections made to connect power, decouple the power supply and terminate signals, respectively.

Referring first to FIG. 3a, a cross-sectional view of printed circuit board 10 of FIG. 1 made through lines 3—3 is shown. A power pin 26 of an integrated circuit or other board-mounted component (not shown) is illustrated soldered in position in hole 14 through contact pad 12a on the top face 16 of printed circuit board 10 to corresponding contact pad 12b on its bottom face 18. Attachment land 22a on the top face 16 of printed circuit board 10 is shown disposed adjacent to and in electrical contact with contact pad 12a and attachment land 24a is shown in electrical contact with first power distribution plane 20a disposed on the top face 16 of printed circuit board 10. Similarly, attachment land 22b is shown on the bottom face 18 of printed circuit board 10 disposed adjacent to and in electrical contact with contact pad 12b and attachment land 24b is shown in electrical contact with second power distribution plane 20b.

In the example illustrated in FIG. 3a, it is desired to connect the power pin 26 of the integrated circuit inserted into hole 14 to the first power distribution plane 20a on the top face 16 of printed circuit board 10. A power bridge 28, essentially comprising a zero ohm chip resistor or a short length of wire, is soldered between attachment lands 22a and 24a. According to a presently preferred embodiment of the invention, power bridge 28 is sized to be compatible with other surface mounted components which will be used in conjunction with the present invention as will be disclosed herein. Those of ordinary skill in the art will recognize that, if it is desired to connect power pin 26 to the other power supply potential, power bridge 28 would be connected between attachment lands 22b and 24b. Such skilled persons will also recognize that other means can be used to make the power connections, including solder bridging, conductive polymers, etc.

FIG. 4a illustrates the connection effected by the power bridge 28 of FIG. 3a. Those of ordinary skill in the art will recognize this type of connection as one power supply distribution connection from a power supply 30 to an integrated circuit or other board-mounted component 32 via connection 34 (comprising power distribution plane 20a (see FIG. 4d) and power pin 26 of component 32).

Referring now to FIG. 3b, a cross-sectional view of printed circuit board 10 of FIG. 1 similar to that shown in FIG. 3a is shown. A power pin 26 of an integrated circuit or other board-mounted component (not shown) is illustrated soldered in position in hole 14 through contact pad 12a on the top face 16 of printed circuit board 10 to corresponding contact pad 12b on its bottom face 18. As in FIG. 3a, attachment land 22a on the top face 26 of printed circuit board 10 is shown disposed adjacent to and in electrical contact with contact pad 12a and attachment land 24a is shown in electrical contact with first power distribution plane 20a disposed on the top face 16 of printed circuit board 10. Similarly, attachment land 22b is shown on the bottom face 18 of printed circuit board 10 disposed adjacent to and in electrical contact with contact pad 12b and attachment land 24b is shown in electrical contact with second power distribution plane 20b. Power bridge 28 is shown connected between attachment land 22a and 24a as in FIG. 3a. In addition, as shown in FIG. 3b, a 0.1 μF chip capacitor 36 is connected as a power supply decoupling capacitor between attachment lands 22b and 24b on the bottom face of printed circuit board 10. FIG. 4b shows the equivalent schematic diagram of the connection illustrated in FIG. 3b wherein the positive terminal of power supply 30 is connected to component 32 via connection 34 (comprising power distribution plane 20a and power pin 26 of component 32), and a decoupling capacitor 36 is connected between the positive and negative potentials of power supply 30 at the power pin 26 of component 32.

Referring finally to FIGS. 3c and 4c, connections to effect signal termination utilizing the printed circuit board configuration of the present invention are illustrated. FIG. 3c is a cross-sectional view of printed circuit board 10 of FIG. 1 similar to that shown in FIGS. 3a and 3b, except that a signal lead pin 38 of an integrated circuit or other board-mounted component (not shown) is soldered into hole 14 and is thus in contact with contact pads 12a and 12b on opposing faces of the printed circuit board 12. As in FIG. 3a, attachment land 22a on the top face 16 of printed circuit board 10 is shown disposed adjacent to and in electrical contact with contact pad 12a and attachment land 24a is shown in electrical contact with first power distribution plane 20a disposed on the top face 16 of printed circuit board 10. Similarly, attachment land 22b is shown on the bottom face 18 of printed circuit board 10 disposed adjacent to and in electrical contact with contact pad 12b and attachment land 24b is shown in electrical contact with second power distribution plane 20b. A first resistor 40 is shown connected between attachment land 22a and 24a and a second resistor 42 is shown connected between attachment lands 22b and 24b.

FIG. 4b shows the equivalent schematic diagram of the connection illustrated in FIG. 3b. The equivalent circuit implemented by the connections shown in FIG. 3c is shown in FIG. 4b, wherein it is assumed that the signal lead pin 30 is connected to the input node of an amplifier 44. Resistors 40 and 42 form a bias network for the input of amplifier 44. Those of ordinary skill in the art will recognize that the present invention is not limited to the use of resistors 32 and 34 and that any other surface mounted components may be connected to the contact pads 12a and 12b depending on the particular circuit application.

Figure 5:
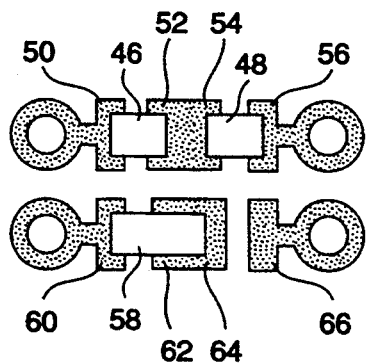
FIG. 5 is a top view of four pairs of attachment lands disposed on a surface of a printed circuit board in accordance with the present invention illustrating how the present invention may be employed to accommodate chip surface-mount components of different sizes.

Referring now to FIG. 5, it may easily be seen how the arrangement of the present invention may be used to accommodate surface mount chip components of different sizes. FIG. 5 is a top view of four pairs of attachment lands disposed on a surface of a printed circuit board in accordance with a presently preferred embodiment of the invention. First sized components 46 and 48 are mounted to the top two pairs of lands comprising lands 50–52 and 54–56. According to one embodiment of the invention, as illustrated in FIG. 2, lands 52 and 54 are separated. According to the embodiment illustrated in FIG. 5, lands 52 and 54 are formed from a single conductive circuit board trace. First sized components may be, for example, 0805 size surface mount components as are known in the art.

As shown in FIG. 5, a single second sized component 58 is mounted on the bottom two pairs of lands 60–62 and 64–66. Second sized components may be, for example, 1206 size surface mount components as are known in the art.

Because of the size of component 58, there is no space to mount a second component between lands 64 and 66. It is presently assumed, however, that the need to connect adjacent pads to the same power distribution plane will be rare, and that the arrangement of the present invention to allow employment of different sized surface mount components will not deleteriously affect the functionality of the invention.

Those of ordinary skill in the art will recognize the advantage provided by the present invention wherein the same layout structure may be used to implement power distribution, power supply decoupling, and signal termination for board-mounted components and circuits. Details of circuit interconnect wiring are unnecessary for an understanding of the present invention and have not been shown. Those of ordinary skill in the art will recognize that numerous interconnection mechanisms, including but not limited to providing other layers in printed circuit board 10 to form a multilayer printed circuit board, are well within the level of ordinary skill in the art, and fall within the scope of the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A printed circuit board comprising:
   first and second surfaces,
   an insulating board material separating and electrically insulating said first and second surfaces, a first array of conductive contact pads disposed on said first surface and a second array of conductive contact pads aligned with said first array of conductive contact pads disposed on said second surface so that individual ones of said first array of conductive contact pads are disposed directly over individual ones of said second array of conductive contact pads, said conductive contact pads having component-mounting holes disposed therethrough so that component mounting holes of said individual ones of said first array of conductive contact pads and component mounting holes of said individual ones of said second array of conductive contact pads form vias through said insulating board material, said first array of conductive contact pads electrically insulated from said second array of conductive contact pads, a structure for providing power distribution, decoupling and signal termination including an array of conductive attachment lands arranged in adjacent pairs and disposed on at least said first surface, each of said pairs including a first attachment land and a second attachment land, said first and second attachment lands insulated from one another and separated by a distance selected to allow surface mounting attachment of standard sized components therebetween on said at least said first surface of the printed circuit board, a conductive power distribution plane disposed on said first surface and insulated from said conductive contact pads and said second attachment lands disposed thereon, said first attachment land of each of said pairs on said first surface of the printed circuit board electrically connected to said power distribution plane, and said second attachment land of each of said pairs on said at least said first surface of the printed circuit board electrically connected to one of said conductive contact pads, and a number of shorting pins inserted through said vias thereby forming electrical connections between corresponding individual ones of said first array of conductive contact pads and corresponding individual ones of said second array of conductive contact pads, said number being an integer greater than zero and less than the total number of vias in the printed circuit board, each of said attachment lands adapted to receive a lead of a surface mounted device.

2. A printed circuit board comprising:
first and second surfaces,
an insulating board material separating and electrically insulating said first and second surfaces,
a first array of conductive contact pads disposed on said first surface and a second array of conductive contact pads aligned with said first array of conductive contact pads disposed on said second surface so that individual ones of said first array of conductive contact pads are disposed directly over individual ones of said second array of conductive contact pads, said conductive contact pads having component-mounting holes disposed therethrough so that component mounting holes of said individual ones of said first array of conductive contact pads and component mounting holes of said individual ones of said second array of conductive contact pads form vias through said insulating board material, said first array of conductive contact pads electrically insulated from said second array of conductive contact pads, a structure for providing power distribution, decoupling and signal termination including an array of conductive attachment lands arranged in adjacent pairs and disposed on said first and second surfaces, each of said pairs including a first attachment land and a second attachment land, said first and second attachment lands insulated from one another and separated by a distance selected to allow surface mounting attachment of standard sized components therebetween on said first and second surfaces of the printed circuit board, a first conductive power distribution plane disposed on said first surface and insulated from said first array of conductive contact pads and said second attachment lands disposed thereon, a second conductive power distribution plane disposed on said second surface and insulated from said second array of conductive contact pads and said second attachment lands disposed thereon, and a number of shorting pins inserted through said vias thereby forming electrical connections between corresponding individual ones of said first array of conductive contact pads and corresponding individual ones of said second array of conductive contact pads, said number being an integer greater than zero and less than the total number of vias in the printed circuit board, said first attachment land of each of said pairs on said first surface of the printed circuit board electrically connected to said first power distribution plane, said first attachment land of each of said pairs on said second surface of the printed circuit board electrically connected to said second power distribution plane, and said second attachment land of each of said pairs on said first and second surfaces of the printed circuit board located adjacent to and electrically connected to one of said conductive contact pads, each of said attachment lands adapted to receive a lead of a surface mounted device.

3. A printed circuit board comprising:
first and second surfaces;
an insulating board material separating and electrically insulating said first and second surfaces;
a first array of conductive contact pads disposed on said first surface and a second array of conductive contact pads aligned with said first array of conductive contact pads disposed on said second surface so that individual ones of said first array of conductive contact pads are disposed directly over individual ones of said second array of conductive contact pads, said conductive contact pads having component-mounting holes disposed therethrough so that component mounting holes of said individual ones of said first array of conductive contact pads and component mounting holes of said individual ones of said second array of conductive contact pads form vias through said insulating board material, at least one but not all individual ones of said first array of conductive contact pads electrically shorted to a corresponding individual one of said second array of conductive contact pads by a conductive shorting pin inserted through a corresponding via, and a structure for providing power distribution, decoupling and signal termination including an array of conductive attachment lands arranged in adjacent pairs and disposed on at least said first surface, each of said pairs including a first attachment land and a second attachment land, said first and second attachment lands insulated from one another and separated by a distance selected to allow surface mounting attachment of standard sized components therebetween on said at least said first surface of the printed circuit board, a conductive power distribution plane disposed on said first surface and insulated from said conductive contact pads and said second attachment lands disposed thereon, said first attachment land of each of said pairs on said first surface of the printed circuit board electrically connected to said power distribution plane, and said second attachment land of each of said pairs on said at least said first surface of the printed circuit board electrically connected to one of said conductive contact pads, each of said attachment lands adapted to receive a lead of a surface mounted device.

4. A printed circuit board comprising:

a first surface including a first printed conductive pattern disposed thereon;

a second surface including a second printed conductive pattern disposed thereon;

an insulating board material separating and electrically insulating said first surface and said second surface;

said first printed conductive pattern including a first array of conductive contact pads and a first array of conductive attachment lands arranged in adjacent pairs, each of said pairs including a first attachment land and a second attachment land, said first and second attachment lands insulated from one another and separated by a distance selected to allow surface mounting attachment of standard sized components therebetween;

said second printed conductive pattern including a second array of conductive contact pads and a second array of conductive attachment lands arranged in adjacent pairs, each of said pairs including a third attachment land and a fourth attachment land, said third and fourth attachment lands insulated from one another and separated by a distance selected to allow surface mounting attachment of standard sized components therebetween;

individual ones of said first array of conductive contact pads oriented over corresponding individual ones of said second array of conductive contact pads and having corresponding vias therethrough which penetrate said individual ones of said first array on conductive contact pads, said insulating board material, and said individual ones of said second array of conductive contact pads;

a first conductive power distribution plane disposed on said first surface and insulated from said conductive contact pads and said second attachment lands disposed thereon;

a second conductive power distribution plane disposed on said second surface and insulated from said conductive contact pads and said fourth attachment lands disposed thereon;

said first attachment land of each of said adjacent pairs on said first surface electrically connected to said first conductive power distribution plane, and said second attachment land of each of said adjacent pairs on said first surface of the printed circuit board electrically connected to an individual one of said first array of conductive contact pads;

said third attachment land of each of said adjacent pairs on said second surface electrically connected to said second conductive power distribution plane, and said fourth attachment land of each of said adjacent pairs on said second surface of the printed circuit board electrically connected to an individual one of said second array of conductive contact pads;

each of said attachment lands adapted to receive a lead of a surface mounted device;

the printed circuit board further comprising shorting pins inserted into at least one but less than all of said vias to short corresponding individual ones of said first array of conductive contact pads on said first surface to corresponding individual ones of said second array of conductive contact pads on said second surface.

* * * * *